United States Patent [19]

Krill

[11] Patent Number: 4,688,007

[45] Date of Patent: Aug. 18, 1987

[54] AIR INLET FOR INTERNAL COOLING OF OVERMODED WAVEGUIDE

[75] Inventor: Jerry A. Krill, Ellicott City, Md.

[73] Assignee: The Johns Hopkins University, Baltimore, Md.

[21] Appl. No.: 771,922

[22] Filed: Sep. 3, 1985

[51] Int. Cl.$^{4}$ .......... H01P 1/00; H03H 7/48

[52] U.S. Cl. .......... 333/137; 333/21 R; 333/248

[58] Field of Search .......... 333/248, 254, 22 F, 333/125, 137, 21 R

[56] References Cited

U.S. PATENT DOCUMENTS

| | | | |
|---|---|---|---|
| 2,421,758 | 6/1947 | Ourebo | 333/22 F |
| 2,669,696 | 2/1954 | Ward | 333/22 F |
| 3,030,592 | 4/1962 | Lamb et al. | 333/248 X |
| 3,312,914 | 4/1967 | Bolster | 333/22 F X |
| 3,634,783 | 1/1972 | Rooney | 333/248 X |
| 3,701,058 | 10/1972 | Smith | 333/157 X |
| 3,796,973 | 3/1974 | Klein | 333/22 F |
| 3,940,719 | 2/1976 | Booth | 333/22 F |
| 3,983,356 | 9/1976 | Jurgensen | 333/22 F X |
| 4,382,239 | 3/1983 | Chen et al. | 333/248 |

*Primary Examiner*—Eugene R. LaRoche
*Assistant Examiner*—Benny T. Lee
*Attorney, Agent, or Firm*—Robert E. Archibald

[57] ABSTRACT

For high power application of overmoded waveguide, air cooling is provided by applying air flow to the overmoded waveguide either directly or indirectly, through an air inlet which does not significantly disturb the internal electromagnetic fields.

13 Claims, 7 Drawing Figures

AIR INLET FOR INTERNAL COOLING OF OVERMODED WAVEGUIDE

STATEMENT OF GOVERNMENTAL INTEREST

The Government has rights in this invention pursuant to contract no. N00024-85-C-5301 awarded by the Department of the Navy.

BACKGROUND OF THE INVENTION

As is well known, waveguides can generally be classified as either fundamental mode or overmoded; i.e. the fundamental mode or conventional waveguide is designed with dimensions which only support the fundamental electromagnetic field or mode configuration for propagation in a given frequency band; whereas, the overmoded waveguide is designed so that several modes could be supported, but internal structure is provided to suppress all but the desired modal configuration. As is also well known, conventional waveguide is restricted in maximum power capacity and in minimum loss due to its required cross-sectional dimensions; whereas, overmoded waveguide can be designed to have arbitrarily high power capacity and low attenuation by appropriately increasing the cross-section. As described in the text by A. E. Karbowiak entitled *Trunk Waveguide Communication*, published by Chapman and Hall, Ltd. (1965), the required suppression of unwanted modes in overmoded waveguide is achieved by using dielectric and metallic structures to restrict allowable modes.

Oftentimes, overmoded waveguide contain a dielectric layer as part of the internal structure for suppression for unwanted modes. For example, in one type of overmoded waveguide used to support the circular $TE_{01}$ mode, the wall of the circular waveguide is constructed of an outer conducting pipe with an inner dielectric lining. In another waveguide configuration, an outer conducting pipe has an inner dielectric sheath which in turn supports a helical wound insulated wire. These two types of overmoded waveguide are discussed in the above-noted Karbowiak reference. As a result of relatively low dielectric thermal conductivity, in these types of overmoded waveguide structures, internally generated heat due to propagation loss is not readily dissipated to the outside wall.

Particularly for high power application of such circular overmoded waveguide, the need exists for a simple and effective method and apparatus for cooling the overmoded waveguide. However, this cooling operation must be performed without significantly disturbing the electromagnetic fields, since this would lead to energy loss into unwanted modes.

DESCRIPTION OF THE INVENTION

In accordance with the present invention, it is proposed to accomplish cooling of overmoded waveguide by introducing a flow of cooling air into the waveguide in a manner which does not significantly disturb the internal electromagnetic fields. This introduction of cooling air is accomplished, in accordance with the present invention, either directly through a wall section of the overmoded waveguide itself, or indirectly by first introducing the air flow into a conventional or rectangular waveguide which is connected to the circular waveguide through a suitable transition structure.

In light of the above discussion, one object of the present invention is to provide cooling to overmoded waveguide.

Another object of the present invention is to provide air cooling for an overmoded waveguide, by means of an air inlet/outlet means connected to the overmoded waveguide in such a manner as to not significantly disturb the waveguide's electromagnetic fields.

A still further object of the present invention is to provide air cooling to overmoded waveguide, by means of direct or indirect connection of the cooling air flow source to the overmoded waveguide.

Other objects, purposes and characteristics features of the present invention will, in part, be discussed as the description of the invention progresses and will, in part, be obvious from the accompanying drawings, wherein.

Figure 5:
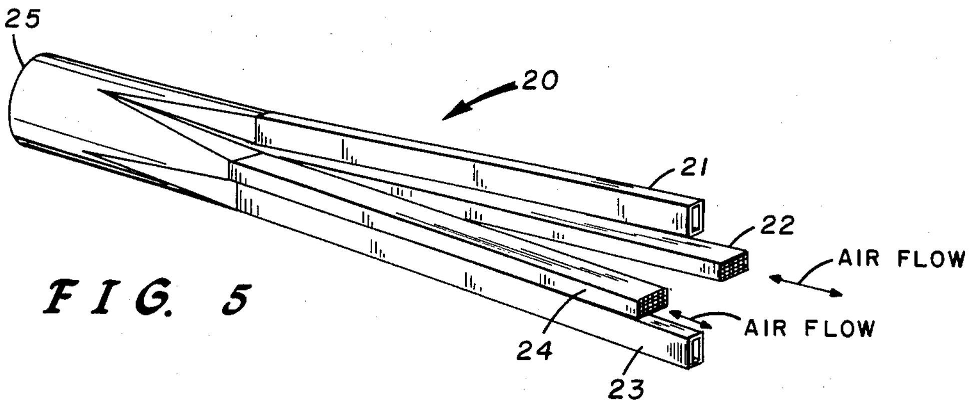
Figure 6:
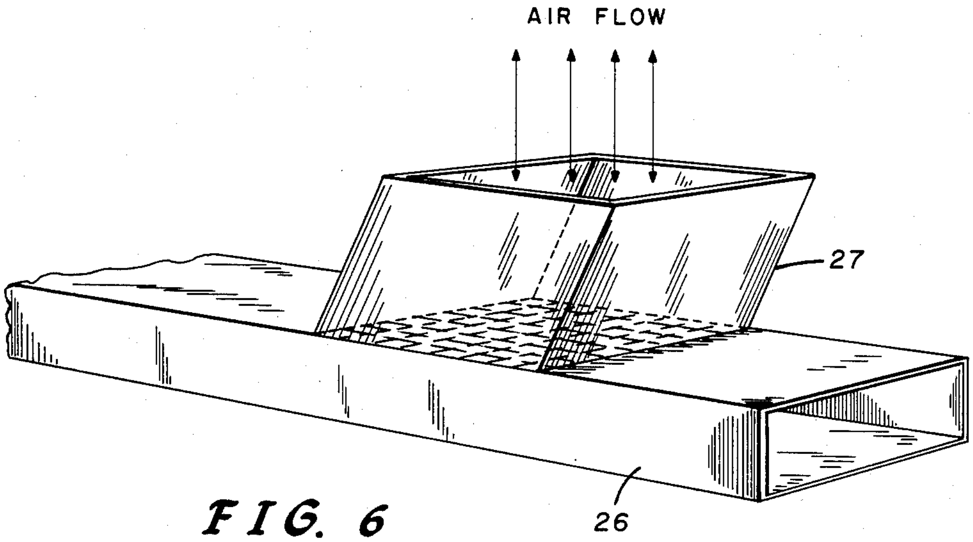
Figure 7:
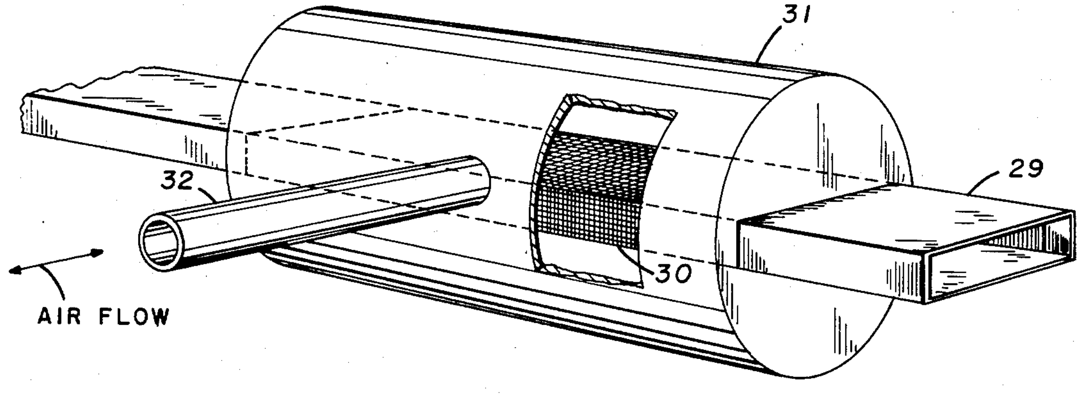

FIG. 5 illustrates a further embodiment of the present invention wherein the cooling air flow is introduced by means of a transition structure utilized to connect a circular overmoded waveguide to a plurality of rectangular or conventional waveguides; and, FIGS. 6 and 7 illustrate two embodiments of a structure for introducing the cooling air flow to a rectangular or conventional waveguide which, in turn, is connected to the overmoded waveguide via a mode transition such as that shown in FIG. 5 or a Marie type (see U.S. Pat. No. 2,859,412).

Figure 1:
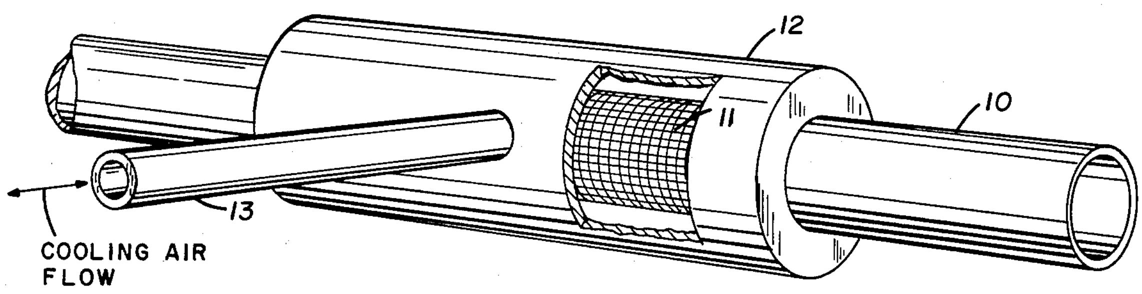
FIG. 1 illustrates the presently preferred embodiment of the present invention for connecting a cooling air flow to and from a circular overmoded waveguide.

In the preferred embodiment of FIG. 1, the circular overmoded waveguide 10 is formed with an inlet/outlet waveguide section 11 (to be described in more detail hereinafter) at a location along the waveguide length at which cooling air is to be input to or output from the waveguide 10. Surrounding the inlet/outlet waveguide section 11 is a cylindrical air jacket or enclosure 12 to which is connected an air inlet/outlet pipe 13 which, in turn, connects to an appropriate source of cooling air flow.

Figure 2:
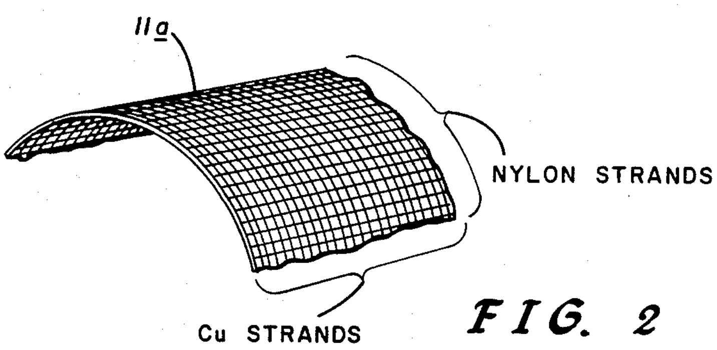
FIGS. 2, 3 and 4 illustrate, in partial section, different embodiments of the air inlet waveguide wall portion of the FIG. 1 embodiment.
Figure 3:
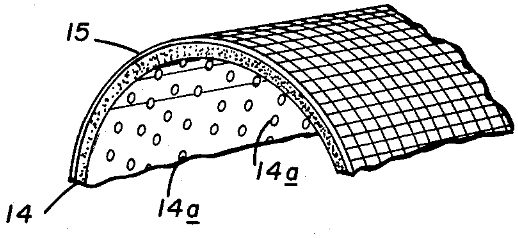
Figure 4:
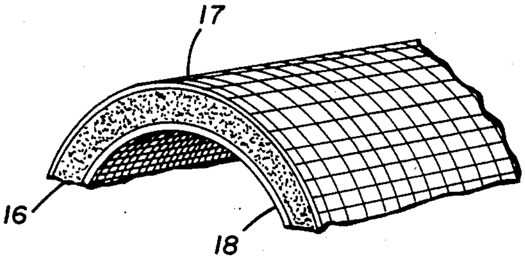

The inlet waveguide section 11 can be constructed or formed in several different manners, three of which are shown in FIGS. 2, 3 and 4. For straight overmoded waveguide which maintains high mode suppression, a simple cylindrical metal screen section **11*a* formed, for example, of a fine copper wire mesh, with diameter precisely matched to the waveguide diameter supporting the $TE_{01}$ mode would be sufficient. Such a section does not suppress unwanted modes, but should not significantly enhance unwanted mode energy, providing that mode-suppressing waveguide is connected to each end of the screen section 11*a* Some mode suppressions can be introduced by the screen 11*a* itself if it consists of a fine mesh of nylon strands in the direction of the longitudinal axis of the waveguide and copper strands in the azimuthal or circumferential direction, as shown in FIG. 2**; i.e. to support $TE_{01}$ mode currents and suppress those of other modes.

Alternatively, in order to retain mode suppression properties, the air inlet/outlet section 11 can be configured, as shown in FIGS. 3 and 4, respectively, as perforated lined and helix overmoded waveguide sections. More specifically, in FIG. 3, the dielectric liner 14 is formed with perforations **14*a* throughout its length and is covered, on its outer surface, by a fine mesh of copper wire 15 or with a thin metallic (e.g. Cu) sheet having small holes or slots therethrough oriented parallel to the wall currents. In the embodiment shown in FIG. 4, the perforated dielectric sheath 16 has a fine mesh copper screen 17 (or perforated metallic sheet) about its outer surface and a fine mesh screen 18 on its inner surface formed of copper azimuthal strands and nylon axial strands, similar to the arrangement shown in FIG. 2. The perforated dielectric liner/sheath used in the embodiments of FIGS. 3 and 4** would have essentially the same electrical properties as for the unperforated dielectric liner/sheath discussed in the Karbowiak reference.

In the embodiments shown in FIGS. 1 through 4 of the drawings, the cooling air flow is introduced directly into the overmoded waveguide 10 at the inlet/outlet waveguide section 11. Depending on the requirements of practice, air inlet/outlet sections configured like section 11 can, of course, be arranged at spaced locations along the length of a long section of overmoded waveguide, in order to provide cooling air flow input/output as needed along the length of the waveguide being cooled.

In the embodiment shown in FIGS. 5, 6 and 7 of the drawings, the cooling air is applied indirectly to the overmoded circular waveguide by first applying it to a conventional or rectangular waveguide. For example, FIG. 5 of the drawings illustrates a multiport rectangular $TE_{10}$ to circular $TE_{01}$ mode transducer 20 of the type disclosed, in detail, in the co-pending and commonly assigned patent application of W. H. Zinger and J. A. Krill Ser. No. 532,892, filed Sept. 16, 1983, now U.S. Pat. No. 4,628,287. In this transition structure, four symmetrically oriented rectangular waveguides 21, 22, 23 and 24 merge into a circular overmoded waveguide portion 25. In accordance with the present invention, two oppositely disposed rectangular waveguides 22 and 24 have metal screens across their extending ends, as shown, and could be used as air inlets/outlets, while the remaining two waveguides 21 and 23 are utilized for mode propagation.

In the further embodiment shown in FIG. 6, cooling air flow is inlet to or outlet from the rectangular waveguide 26 (and therefore to the connected overmoded circular waveguide, not shown, via a mode transition) by means of an air duct 27 which conducts the air flow to and from the inside of the waveguide 26 by means of an inlet/outlet wall surface formed in the upper wall of the waveguide 26, and consisting of fine copper screen, small holes in the upper waveguide wall, or slits oriented in the upper wall along or parallel to wall currents of the rectangular $TE_{10}$ mode. Alternatively, as shown in FIG. 7, the rectangular waveguide 29 might include an inlet/outlet section 30 which is enclosed within by the cylinder 31 connected to an air flow inlet/outlet pipe 32. As with the embodiment shown in FIG. 1, the inlet/outlet section 30 might formed of fine copper wire or screen, small holes in the waveguide walls, or slits parallel to the mode currents. The rectangular waveguides 26 and 29 shown in FIGS. 6 and 7 respectively, could then be connected to the circular overmoded waveguide, for example, by a transition structure such as is shown in FIG. 5.

It should be pointed out here that use of the transition structure of FIG. 5, employing four rectangular to one circular overmoded waveguide and utilizing the opposite rectangular waveguide members 22 and 24 for air inlet/outlet, can obviously be expanded to any even number of multiple rectangular waveguides feeding a transition, provided the transition is properly matched and the R.F. feed waveguides are axially symmetric for $TE_{01}$ mode purity.

Various other modifications, adaptations and alterations to the structures of the present invention over and above those suggested hereinabove, are of course possible in light of the above teaching. Therefore, it should be understood that within the scope of the appended claims, the invention may be practiced otherwise than as specifically described.

What is claimed is:

1. In a waveguide system including at least one overmoded waveguide, the improvement for air cooling said overmoded waveguide structure and comprising, a cooling air flow, and an air inlet/outlet means for connecting said cooling air flow to and from the inside of said overmoded waveguide, said air inlet/outlet means comprises a wall section of said overmoded waveguide formed with air passageways to permit the passage of air to and from the inside of said overmoded waveguide without significantly disturbing the electromagnetic fields within said waveguide.

2. The improvement specified in claim 1 wherein said wall section is formed of a fine mesh copper screen.

3. The improvement specified in claim 1 wherein said overmoded waveguide is cylindrical in shape with a longitudinal axis and a circular cross-section and said wall section is formed of a mesh comprising copper strands extending azimuthally around the circumference of said waveguide and nylon strands extend parallel to the longitudinal axis of said waveguide.

4. The improvement specified in claim 1 wherein electric currents within the waveguide walls are directed around the periphery of said waveguide and said wall section is formed of copper with multiple apertures therethrough arranged around the periphery of said waveguide substantially parallel to electric currents within the waveguide walls.

5. The improvement specified in claim 1 further comprising an enclosure means surrounding said wall section and connected to said cooling air flow.

6. The improvement specified in claim 1 wherein said at least one overmoded waveguide has a cylindrical shape with a wall structure formed of a hollow metallic cylinder having an inner surface and a hollow cylindrical dielectric means having an outer surface disposed within said metallic cylinder with the outer surface of said dielectric means contacting the inner surface of said metallic cylinder, said cylindrical dielectric means and said hollow metallic cylinder each being formed with apertures therethrough to permit the passage of said cooling air flow into and out of said at least one overmoded waveguide.

7. The improvement specified in claim 6 wherein said hollow metallic cylinder is formed from a thin sheet of metal having apertures formed therethrough.

8. The improvement specified in claim 6 wherein said hollow metallic cylinder is formed from a metallic mesh.

9. The improvement specified in claim 6 wherein said hollow cylindrical dielectric means has an inner surface which supports a second hollow metallic cylinder formed with apertures therethrough to permit the passage of said cooling air flow into and out of said at least one overmoded waveguide.

10. The improvement specified in claim 9 wherein said second hollow metallic cylinder is formed of mesh having metallic strands extending circumferentially within said cylindrical waveguide structure and nylon strands extending longitudinally within said cylindrical waveguide structure.

11. The improvement specified in claim 6 further including a cylindrical enclosure means surrounding at least a portion of said wall structure of said at least one overmoded waveguide and connected to said cooling air flow.

12. In a waveguide system including at least one overmoded waveguide, the improvement for air cooling said overmoded waveguide structure and comprising, a cooling air flow, and an air inlet/outlet means for connecting said cooling air flow to and from the inside of said overmoded waveguide, said waveguide system including at least one circular overmoded waveguide, at least two rectangular waveguides, and at least one transition structure for interconnecting said circular and rectangular waveguides, said transition structure having a circular end portion for connecting to said circular overmoded waveguide and a plurality of interconnected rectangular leg portions, at least two of said rectangular leg portions being connected to respective rectangular waveguides and the remainder of said rectangular leg portions of said transition structure comprising said air inlet/outlet means and each having a metallic screen connected across its extending end and being connected to said cooling air flow.

13. In a waveguide system including at least one overmoded waveguide, the improvement for air cooling said overmoded waveguide structure and comprising, a cooling air flow, and an air inlet/outlet means for connecting said cooling air flow to and from the inside of said overmoded waveguide, said waveguide system including at least one circular overmoded waveguide, at least one rectangular waveguide, and a transition structure for interconnecting said at least one circular overmoded waveguide to said at least one rectangular waveguide, and wherein said air inlet/outlet means includes a wall section of said at least one rectangular waveguide connected to said cooling air flow and formed to permit passage of air to and from the inside of said at least one rectangular waveguide.

* * * * *